United States Patent [19]
Smith et al.

[11] Patent Number: 5,529,952
[45] Date of Patent: Jun. 25, 1996

[54] METHOD OF FABRICATING LATERAL RESONANT TUNNELING STRUCTURE

[75] Inventors: Bryan D. Smith, Cambridge, Mass.; John N. Randall, Richardson; Gary A. Frazier, Garland, both of Tex.

[73] Assignee: Texas Instruments Incorporated, Dallas, Tex.

[21] Appl. No.: 309,994

[22] Filed: Sep. 20, 1994

[51] Int. Cl.⁶ ................................. H01L 21/44
[52] U.S. Cl. ................. 437/184; 437/180; 437/228; 117/88; 204/192.12; 204/298.02
[58] Field of Search ................. 437/180, 184; 117/88; 148/DIG. 26; 204/192.12, 298.02

[56] References Cited

U.S. PATENT DOCUMENTS

| | | | |
|---|---|---|---|
| 4,214,966 | 7/1980 | Mahoney | 437/184 |
| 4,525,919 | 7/1985 | Fabian | 437/184 |
| 4,872,947 | 10/1989 | Wang et al. | 204/192.12 |
| 4,997,779 | 3/1991 | Kohno | 437/184 |
| 5,362,372 | 11/1994 | Tepman | 204/192.12 |

FOREIGN PATENT DOCUMENTS

| | | | |
|---|---|---|---|
| 77682 | 6/1977 | Japan | 437/184 |
| 71981 | 6/1981 | Japan | 437/184 |
| 2-41132 | 9/1989 | Japan | 437/184 |
| 61-32315 | 5/1994 | Japan | 437/184 |

*Primary Examiner*—R. Bruce Breneman
*Assistant Examiner*—Ramamohan Rao Paladugu
*Attorney, Agent, or Firm*—Carlton H. Hoel; W. James Brady, III; Richard L. Donaldson

[57] ABSTRACT

A resonant tunneling diode (400) with lateral carrier transport through tunneling barriers (404, 408) grown as a refilling of trenches etched into a transverse quantum well (410) and defining a quantum wire or quantum dot (406). The fabrication method uses angled deposition to create overhangs at the top of openings which define sublithographic separations for tunneling barrier locations.

5 Claims, 17 Drawing Sheets

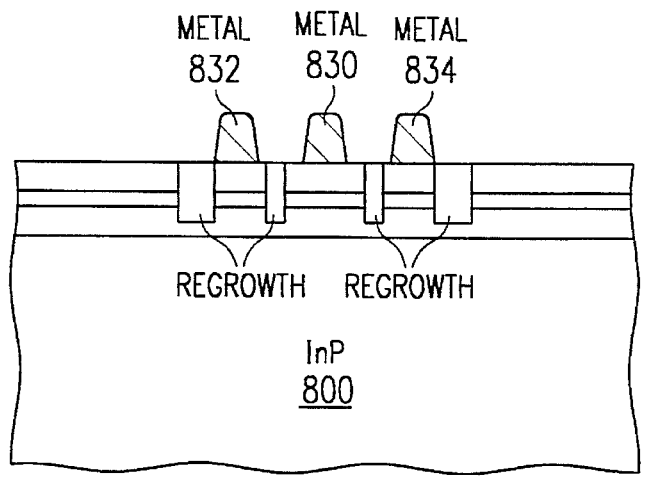
FIG. 8p
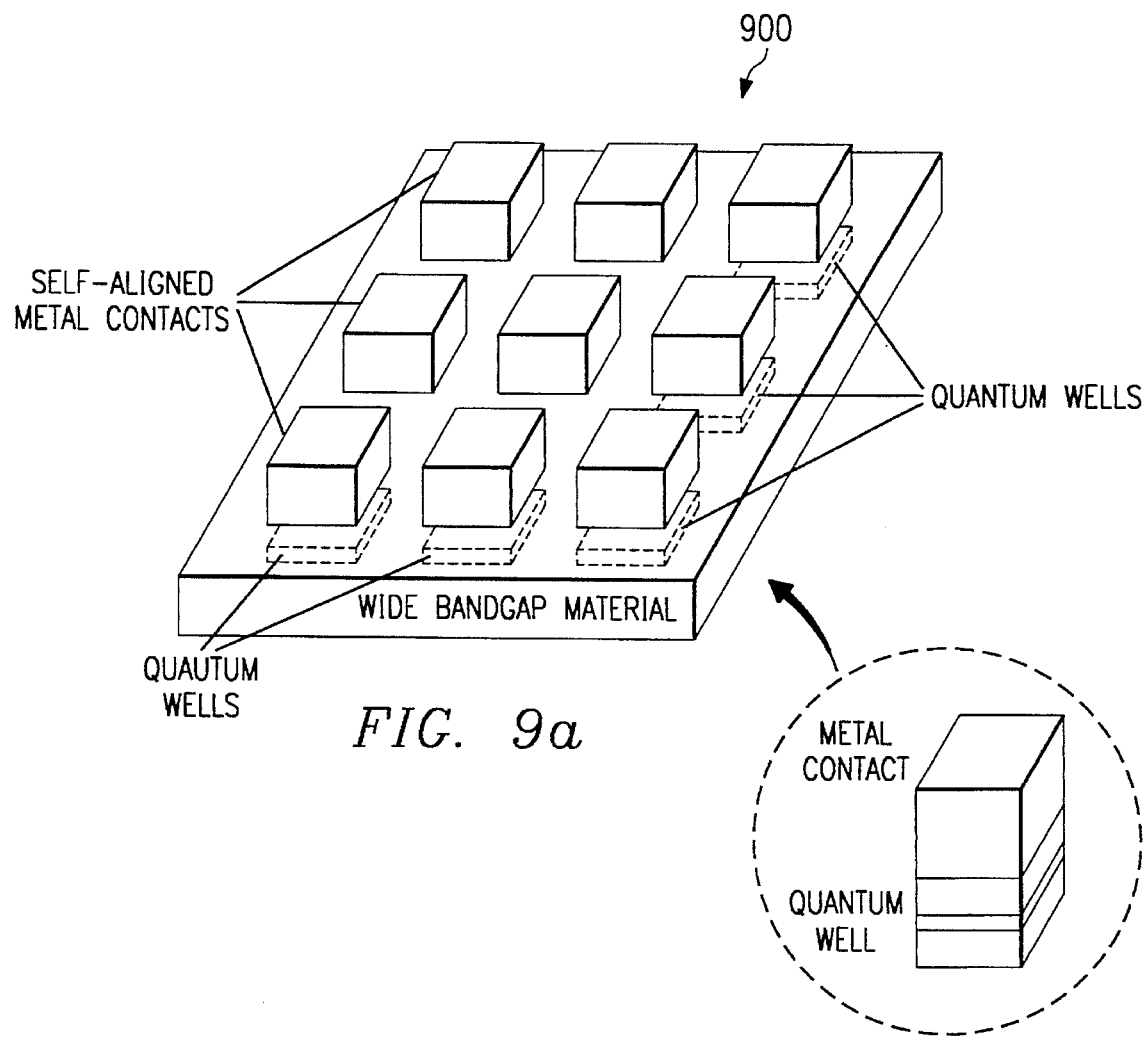
FIG. 9a
FIG. 9b

METHOD OF FABRICATING LATERAL RESONANT TUNNELING STRUCTURE

BACKGROUND OF THE INVENTION

The invention relates to electronic devices, and, more particularly, to quantum mechanical resonant tunneling devices and systems and fabrication methods.

The continual demand for enhanced transistor and integrated circuit performance has resulted in improvements in existing devices, such as silicon bipolar and CMOS transistors and gallium arsenide MESFETs, and also in the introduction of new device types and materials. In particular, scaling down device sizes to enhance high frequency performance leads to observable quantum mechanical effects such as carrier tunneling through potential barriers. This led to development of alternative device structures such as resonant tunneling diodes and resonant tunneling hot electron transistors which take advantage of such tunneling phenomena.

Resonant tunneling diodes are two terminal devices with conduction carriers tunneling through potential barriers to yield current-voltage curves with portions exhibiting negative differential resistance. Recall that the original Esaki diode had interband tunneling (e.g., from conduction band to valence band) in a heavily doped PN junction diode. An alternative resonant tunneling diode structure relies on resonant tunneling through a quantum well in a single band; see FIG. 1 which illustrates a AlGaAs/GaAs quantum well. Further, Mars et al., Reproducible Growth and Application of AlAs/GaAs Double Barrier Resonant Tunneling Diodes, 11 J.Vac. Sci. Tech. B 965 (1993), and Özbay et al, 110-GHz Monolithic Resonant-Tunneling-Diode Trigger Circuit, 12 IEEE Elec. Dev.Lett. 480 (1991), each use two AlAs tunneling barriers imbedded in a GaAs structure to form a quantum well resonant tunneling diode. The quantum well may be 4.5 nm thick with 1.7 nm thick tunneling barriers. FIG. 2 illustrates current-voltage behavior at room temperature. Note that such resonant tunneling "diodes" are symmetrical. With the bias shown in FIG. 3a, a discrete electron level (bottom edge of a subband) in the quantum well aligns with the cathode conduction band edge, so electron tunneling readily occurs and the current is large. Contrarily, with the bias shown in FIG. 3b the cathode conduction band aligns between quantum well levels and suppresses tunneling, and the current is small.

U.S. Pat. No. 4,912,531 shows lateral resonant tunneling through quantum dots of GaAs surrounded by AlGaAs and with metal electrodes over the tunneling quantum dots to modulate the potential in the quantum dots analogous to MOSFET operation. Similarly, U.S. Pat. No. 5,234,848 discloses resonant tunneling diodes formed laterally in a semiconductor wafer which allows simple layout and interconnection of such devices.

In contrast to vertical resonant tunneling structures which may use planar grown layers for the very thin tunneling barriers, lateral resonant tunneling structures essentially must form tunneling barriers by lithography to define the location of the barriers followed by etching and filling with barrier material. Such lithography of lines 1–15 nm wide (tunneling barrier thickness) lies well beyond the capability of standard integrated circuit optical lithography, so special approaches have been taken, such as electron beam (e-beam) or ion beam lithography. However, the known methods are difficult to perform.

U.S. Pat. No. 4,599,790 discloses a method for fabrication of a microwave MESFET gate with gate length on the order of 0.1 μm. The method uses oblique depositions of metal on an opening in a photoresist layer to define a sublithographic opening, and then etches a trench in the underlying layer using this sublithographic opening. Lastly, gate metal deposition fills the trench to form a recessed gate.

SUMMARY OF THE INVENTION

The present invention provides lateral resonant tunneling structures and fabrication methods which include sublithographic elements formed by multiple angled depositions for linewidth definition with two or more tunneling barriers plus the quantum well between being simultaneously defined.

This has technical advantages including fabrication of resonant tunneling devices with robust processing steps.

BRIEF DESCRIPTION OF THE DRAWINGS

The drawings are schematic for clarity.

FIG. 9 illustrates in perspective view an array of quantum dots preferred embodiment resonant tunneling structure.

DESCRIPTION OF THE PREFERRED EMBODIMENTS

Overview of lateral tunneling barrier diode

Figure 1:
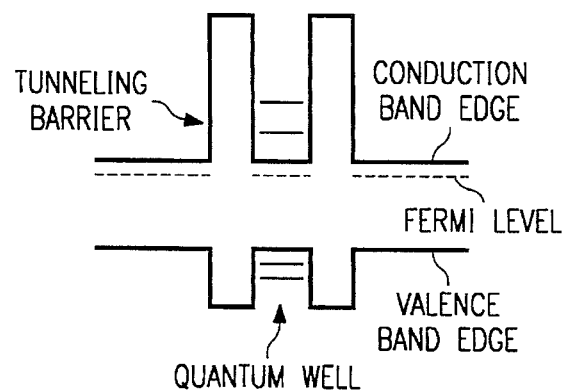
FIGS. 1–3b are band diagrams of a known resonant tunneling diode together with a current-voltage diagram.
Figure 2:
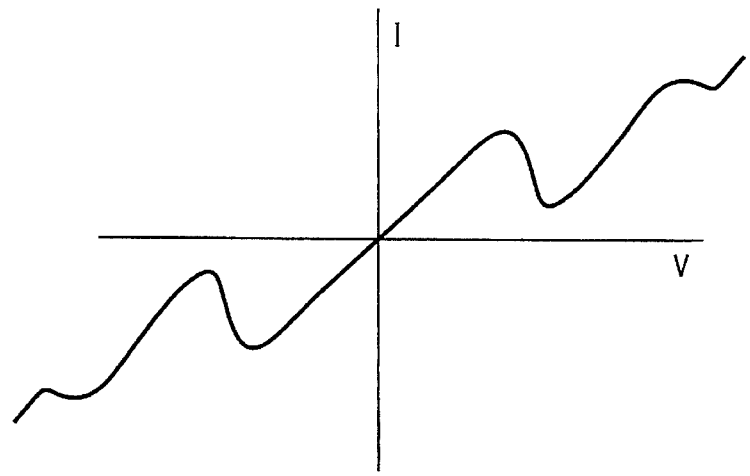
Figure 3A:
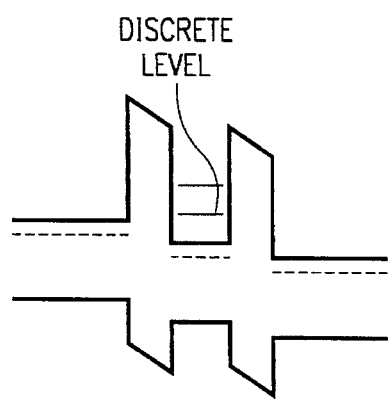
Figure 3B:
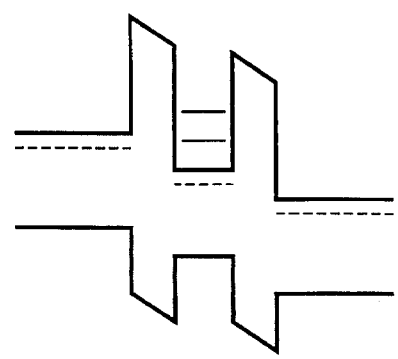
Figure 4A:
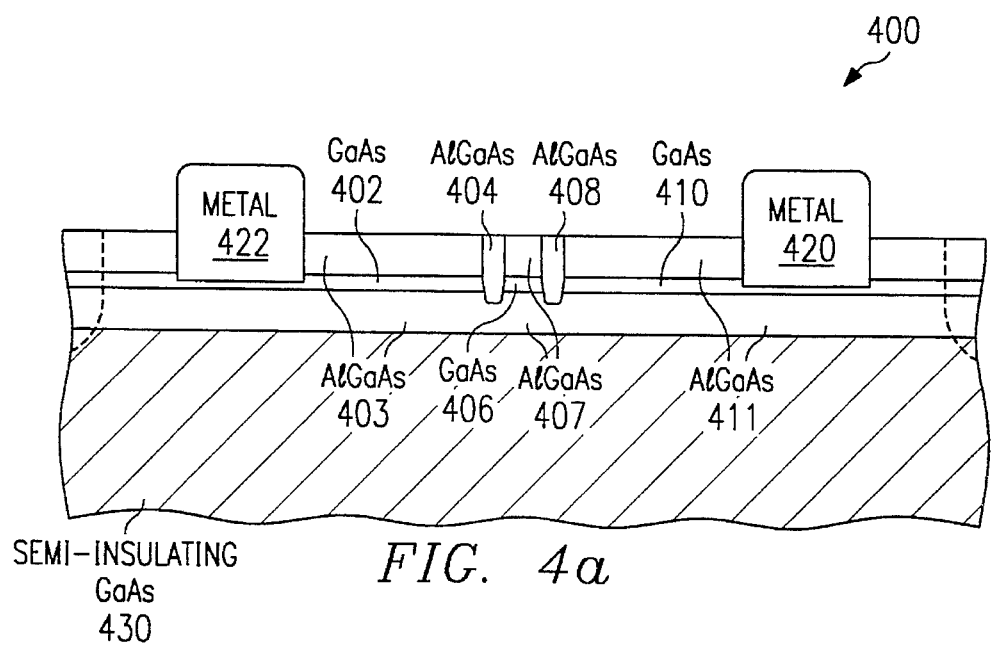
FIGS. 4a–b illustrate a first preferred embodiment resonant tunneling diode in cross sectional elevation and plan views.
Figure 4B:
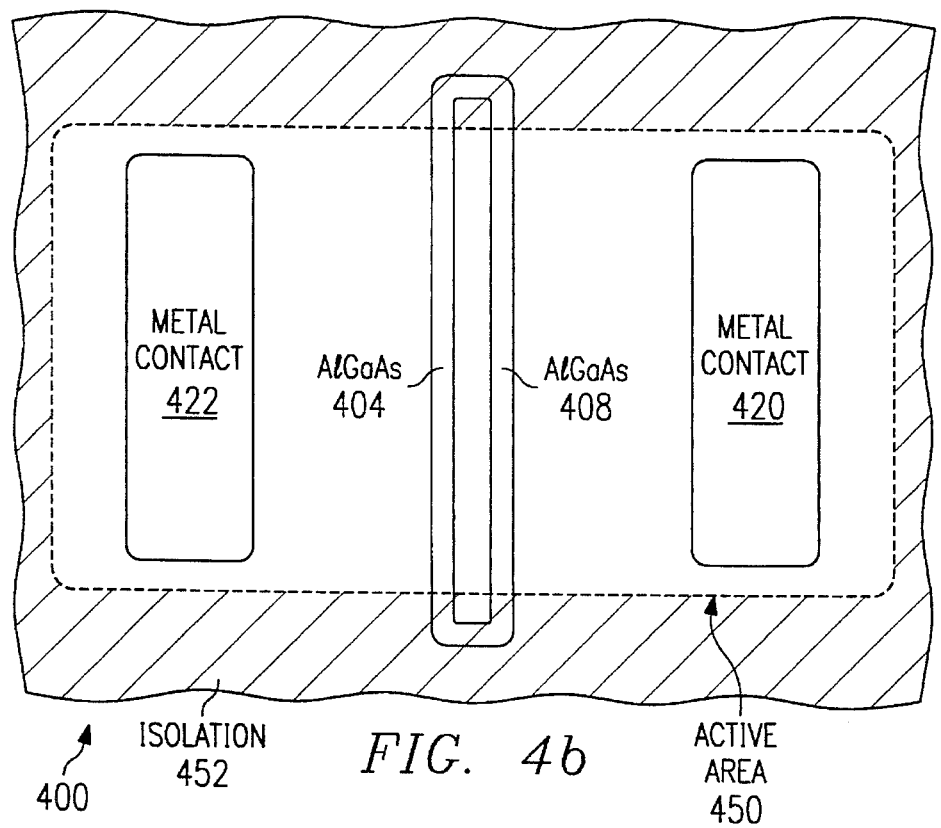

FIGS. 4a–b heuristically show first preferred embodiment resonant tunneling diode, generally denoted by reference numeral 400, in cross sectional elevation and plan views as including gallium arsenide (GaAs) anode 402 with aluminum gallium arsenide ($Al_xGa_{1-x}As$) cladding 403, AlGaAs tunneling barrier 404, GaAs quantum well 406 with AlGaAs cladding 407, AlGaAs tunneling barrier 408, GaAs cathode 410 with AlGaAs cladding 411, anode metal contact 422, and cathode metal contact 420 all on semi-insulating GaAs substrate 430. The plan view in FIG. 4b illustrates active area 450 and its complement electrical isolation 452; the isolation may be crystal damage. Tunneling barriers 404/408 are each about 2 nm thick (horizontal direction in FIGS. 4a–b) and about 20 μm wide (vertical direction in FIG. 4b). Anode 402 and cathode 410 are about 50 nm thick (vertical direction in FIG. 4a) with the AlGaAs claddings 403 and 411 about 100 nm thick on each side of the GaAs. Quantum well 406 is about 6 nm long (horizontal in FIG. 4a) and 50 nm thick with AlGaAs cladding 407 about 100 nm thick on each side of the GaAs. Note that the thickness of barriers 404/408 primarily impacts the tunneling current magnitude and not the resonance levels which derive from the quantum well dimensions and the barrier heights. The fraction of aluminum arsenide in AlGaAs (i.e., the x subscript) determines the barrier height, and x=0.45 gives a barrier height of about 0.55 eV. The GaAs and AlGaAs are doped n-type, and the conduction band discontinuity implies the GaAs (anode, quantum well, and cathode) capture the conduction band electrons from the AlGaAs (modulation doping) leaving a positive charge in the AlGaAs. Metal contacts 420 and 422 are about 10 μm by 20 μm (plan view) and connect to the anode and cathode GaAs.

The length and thickness of quantum well 406 as 6 nm by 50 nm implies the edges of the lowest few conduction subbands should be on the order of 100 meV above the conduction band edge due to the two quantized components of crystal momentum in the quantum well. Note that the quantum well effectively has a one-dimensional (in the vertical direction in FIG. 4b) character and could be termed a quantum wire with the resonant tunneling transversely through the quantum wire.

Figure 5A:
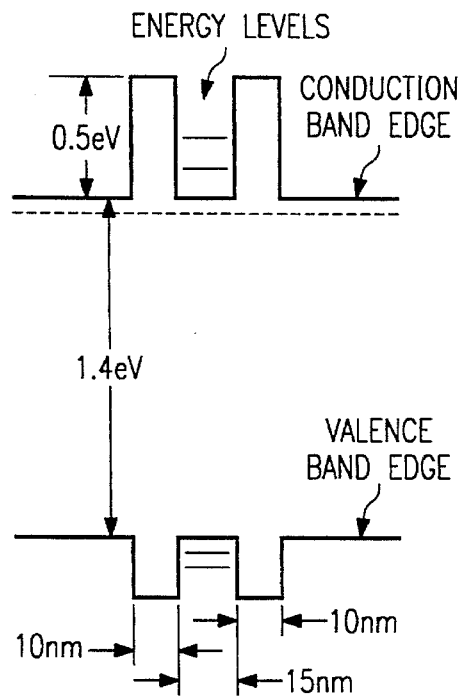
FIGS. 5a–c are band diagrams for the first preferred embodiment diode with various biases.
Figure 5B:
Figure 5B:
Figure 5C:

The conduction band offset at the AlGaAs/GaAs interface is about 0.5 eV, so FIG. 5a–c represents the band diagram for room temperature electron conduction through diode 400. In FIG. 5a a zero bias produces no current; in FIG. 5b a bias of approximately 100 mV across diode 400 yields the first resonant peak current; and in FIG. 5c a bias of approximately 150 mV across diode 400 leads to the first valley current. The majority of the applied bias between anode and cathode appears across the barriers and quantum well.

Tunneling barriers 404/408 are fabricated by sublithographic trenching followed by AlGaAs regrowth to fill the trenches. Thus the AlGaAs of the tunneling barriers may have a composition differing from the AlGaAs cladding the GaAs.

Fabrication

FIGS. 6a–d illustrate in cross sectional elevation views a first preferred embodiment method of fabrication of diode 400 which includes the following steps:

(1) Begin with four-inch-diameter, semi-insulating GaAs wafer 600 with (100) orientation and 500 μm thickness as the growth substrate. Then grow (such as by metalorganic chemical vapor deposition or molecular beam epitaxy) the epitaxial layers as listed in following Table I; note that AlGaAs denotes $Al_xGa_{1-x}As$ for X a fraction such 0.4, and that silicon provides the n-type doping.

TABLE I

| Layer | Material | Thickness |
| --- | --- | --- |
| Cladding | n-AlGaAs | 100 nm |
| Quantum well | n-GaAs | 50 nm |
| Cladding | n-AlGaAs | 100 nm |
| Buffer | GaAs | 1 μm |
| Substrate | s.i. GaAs | 500 μm |

The buffer layer provides a low detect surface for the cladding and quantum well growth. The doping level of the n-type AlGaAs and GaAs is roughly $1\times10^{18}$ atoms/cm$^3$.

(2) Spin polymethylmethacrylate (PMMA) onto layered wafer 600 to a thickness of about 150 nm. PMMA is an e-beam resist. Then use an e-beam to expose a near-minimum linewidth (200 nm wide) line which is 25 μm long in the PMMA; the quantum well will lie along the center of this line. Develop the PMMA; see FIG. 6a.

(3) Insert coated wafer 600 into a low pressure chemical vapor deposition (LPCVD) chamber and deposit with plasma assistance 95 nm of low temperature, conformal silicon nitride ("nitride") 620 from silane plus ammonia. See FIG. 6b which illustrates the conformal deposition that leaves an depression of width about 10 nm as illustrated. The thickness of nitride 620 can be accurately controlled by a slow, low pressure deposition, and the nitride thickness determines the width of the depression. The deposition temperature is low enough so the PMMA can survive.

Figure 6A:
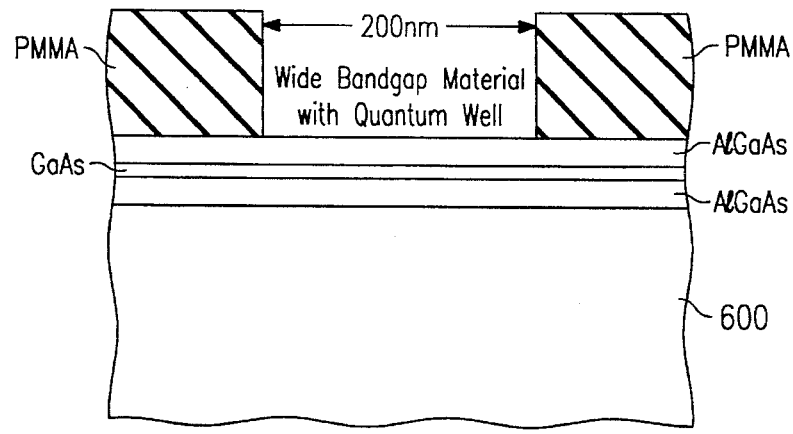
FIGS. 6a–k show fabrication steps of the first preferred embodiment method.
Figure 6B:
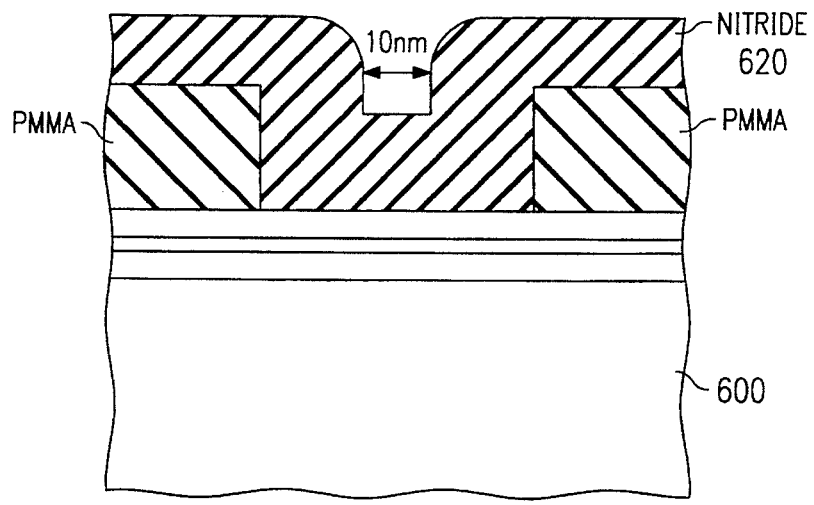
Figure 6C:
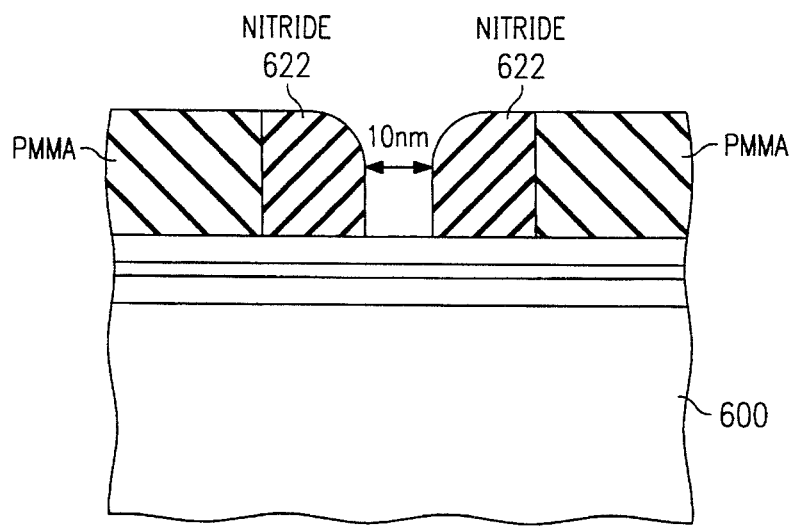

(4) Insert nitrided wafer 600 into a plasma etcher and anisotropically etch nitride 620 to remove about 80–100 nm. This effectively removes nitride 620 from horizontal areas and leaves only nitride filaments 622 on the vertical sidewalls of the PMMA. The etch exposes AlGaAs, but with an etch chemistry of fluoride provides selectivity for nitride over AlGaAs. See FIG. 6c. Note that a moderate overetch does not effect the width of the opening and the size of the exposed portion of AlGaAs due to the verticality of the original nitride 620 sidewalls as shown in FIG. 6b.

Figure 6D:
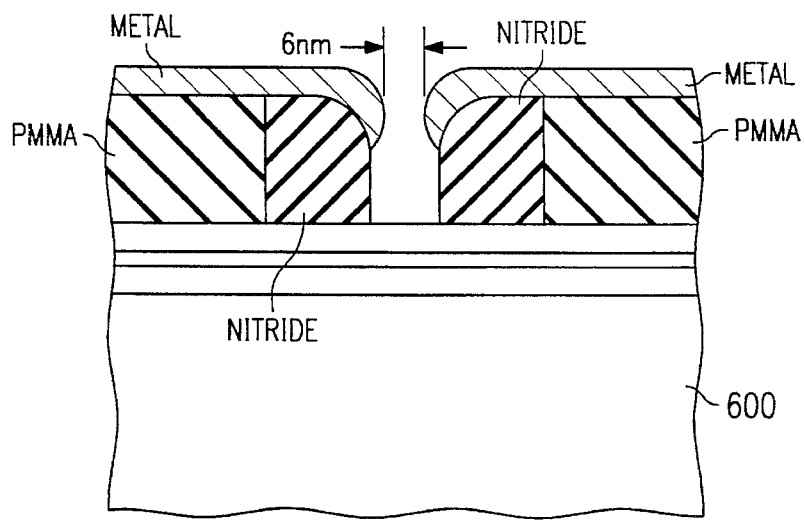

(5) Insert nitride-etched wafer 600 into a metal evaporation chamber and perform angled deposition of about 10 nm of aluminum with angles of ±45° to the wafer surface and perpendicular to the line of exposed AlGaAs. The deposition alternates between the two angles to put essentially the same amount of metal on each nitride sidewall as illustrated in FIG. 6d. This effectively symmetrically narrows the opening over the exposed AlGaAs to about 6 nm.

Figure 6E:
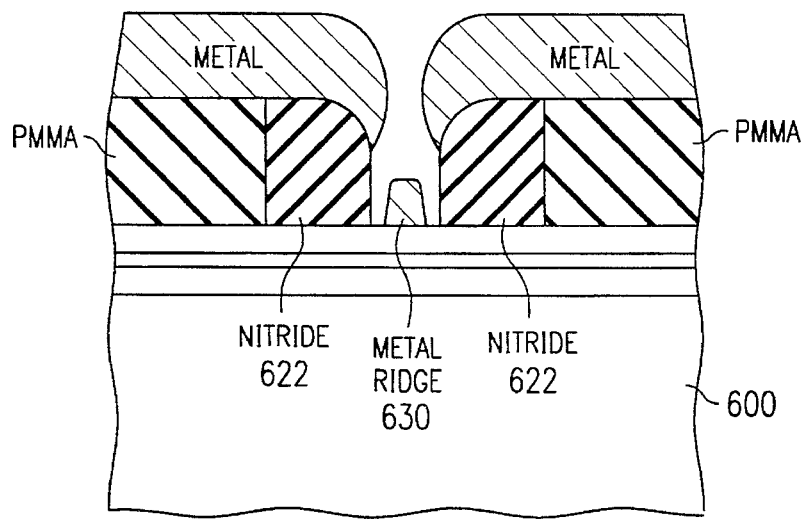

(6) After the angled deposition of metal, reorient the wafer and deposit 30 nm more aluminum but perpendicular to the wafer surface. This both thickens the existing aluminum on each nitride filament 622 and forms a freestanding metal ridge 630 about 30 nm high and 6 nm wide at the base and 25 μm long on the exposed AlGaAs; see FIG. 6e. The overhang of the metal deposited in the angled deposition insured the 2 nm separation of the base of metal ridge 630 from nitride filaments 622.

Figure 6F:
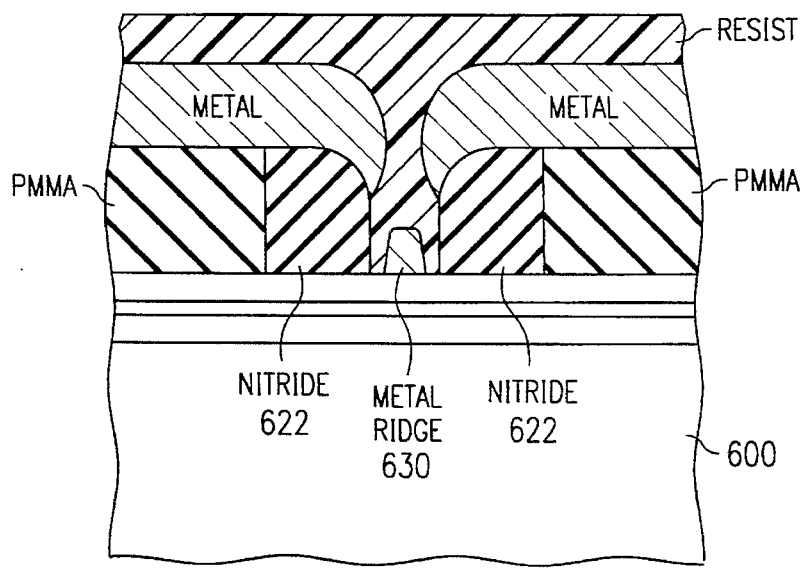
Figure 6G:
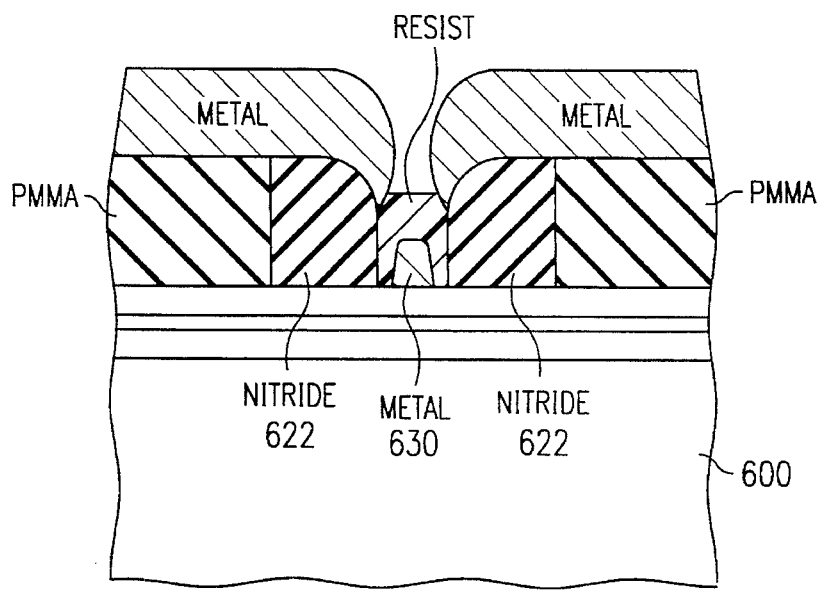
Figure 6H:
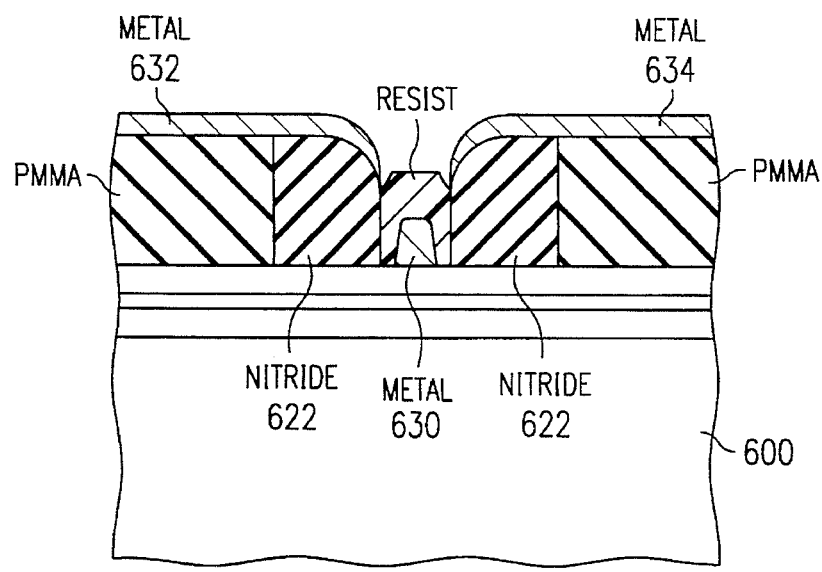

(7) Spin on about 50–100 nm of photoresist (or PMMA) on the wafer to fill the space between the nitride filaments and planarize as shown in FIG. 6f. Next, ash (plasma etch) the photoresist in an oxygen plasma, but stop the etch before completion to leave photoresist on metal ridge 630 as illustrated in FIG. 6g. Then thin the exposed metal on nitride filaments 622 and the PMMA with either a timed wet etch or a timed $BCl_3+Cl_2$ plasma etch. See FIG. 6h. Leaving some metal 632–634 on the PMMA simplifies the regrowth step but is not necessary; however, enough metal must be removed to permit the anisotropic etching the AlGaAs and GaAs in the next step.

Figure 6I:
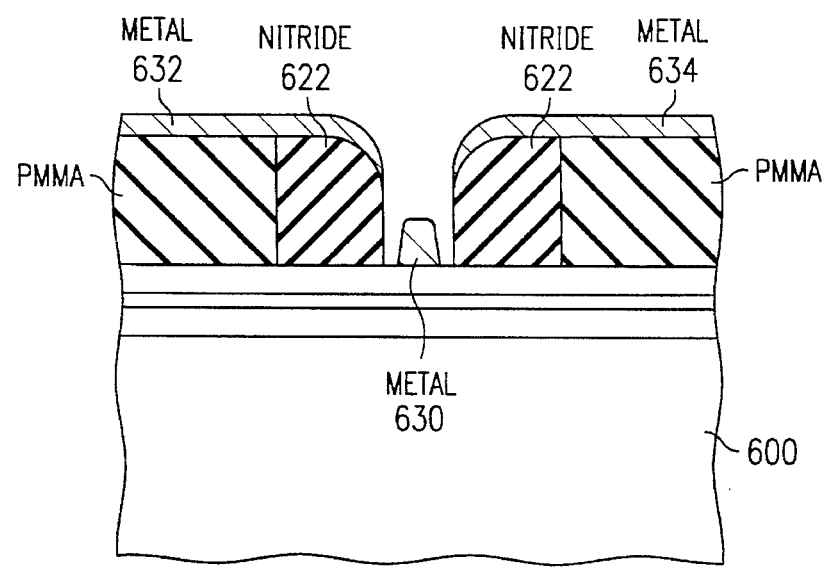
Figure 6J:
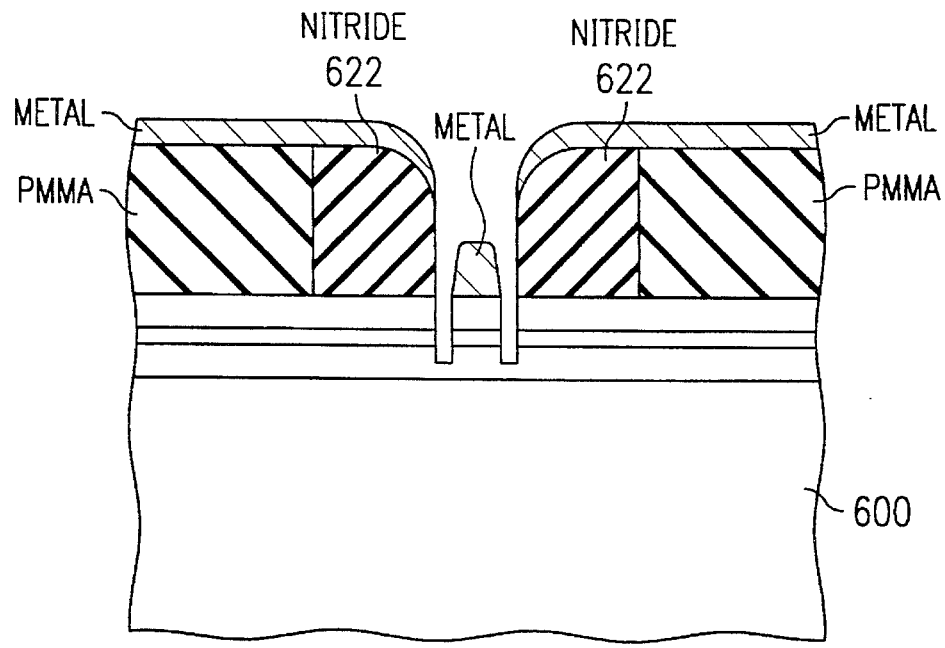

(8) Remove the photoresist remaining on metal ridge 630; see FIG. 6i. Then use the metal 630–632–634 as the etch mask for an anisotropic plasma etch of AlGaAs and GaAs with chlorine but without $BCl_3$ for breakthrough to limit the erosion of metal ridge 630. This forms a trench on each side of metal ridge 630 having a width of 2 nm and a depth of between 130 and 200 nm. See FIG. 6j.

Figure 6K:
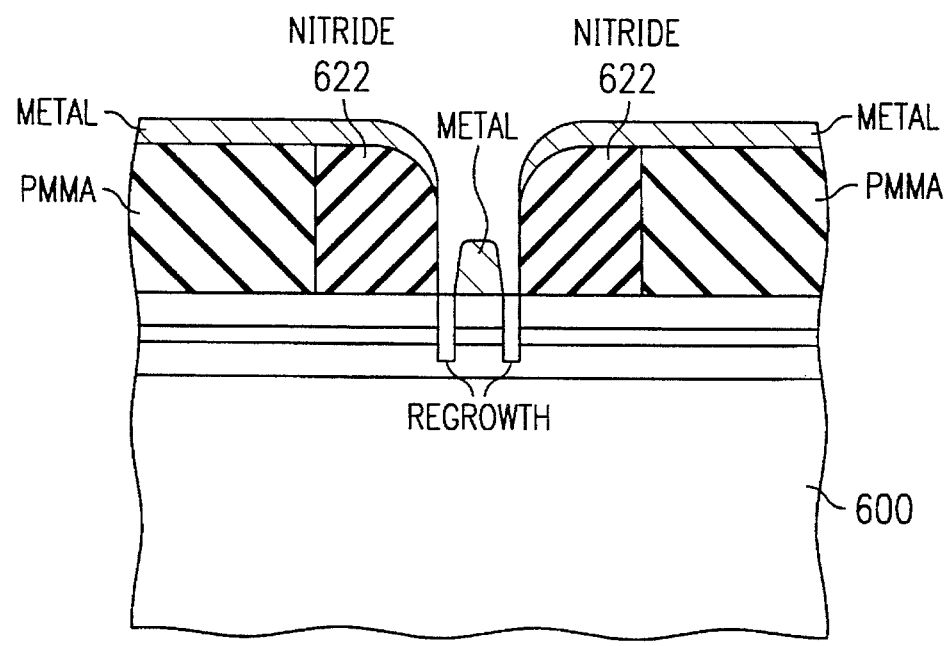

(9) Insert the wafer into an MBE growth chamber and grow AlGaAs to fill the trench around metal ridge 630; this will form the tunneling barriers, and the portion of GaAs beneath metal ridge 630 will form the quantum well. The AlGaAs does not grow on the metal or nitride; see FIG. 6k.

(10) Strip metal 630–632–634 with a wet etch such as HCl in water which etches aluminum selectively over GaAs (or plasma etch). Then strip nitride filaments 622 with a fluorine plasma, and ash the PMMA with an oxygen plasma. This leaves the AlGaAs as the top surface of the wafer.

(11) Spin on photoresist and pattern it to define the isolation region, and implant protons to damage the AlGaAs and GaAs crystal structure to form the isolation region. Strip the photoresist and spin a another layer of photoresist and pattern it to define the anode and cathode ohmic contacts and form the metal contacts by liftoff. This completes the diode as shown in FIGS. 4a–b.

An alternative which preserves metal ridge 630 follows the same steps up through the AlGaAs regrowth to form the tunneling barriers in step (9) and then repeats the photoresist spin on and partial etchback as in step (7) and FIGS. 6f–g. Next, the thinned metal 632–634 is stripped with a wet etch (or plasma etch) while the remaining photoresist protects metal ridge 630. Then follow step (10) and strip the nitride and PMMA (plus photoresist) and form ohmic contacts by liftoff.

A contact to metal ridge 630 may be formed and used to modulate energy levels in the quantum well.

Note that with angled deposition from only one direction will yield a single opening as the vertical deposition will touch the PMMA on one side. This could be used for an isolated tunneling barrier.

Multiple lateral resonant tunneling structure

Figure 7A:
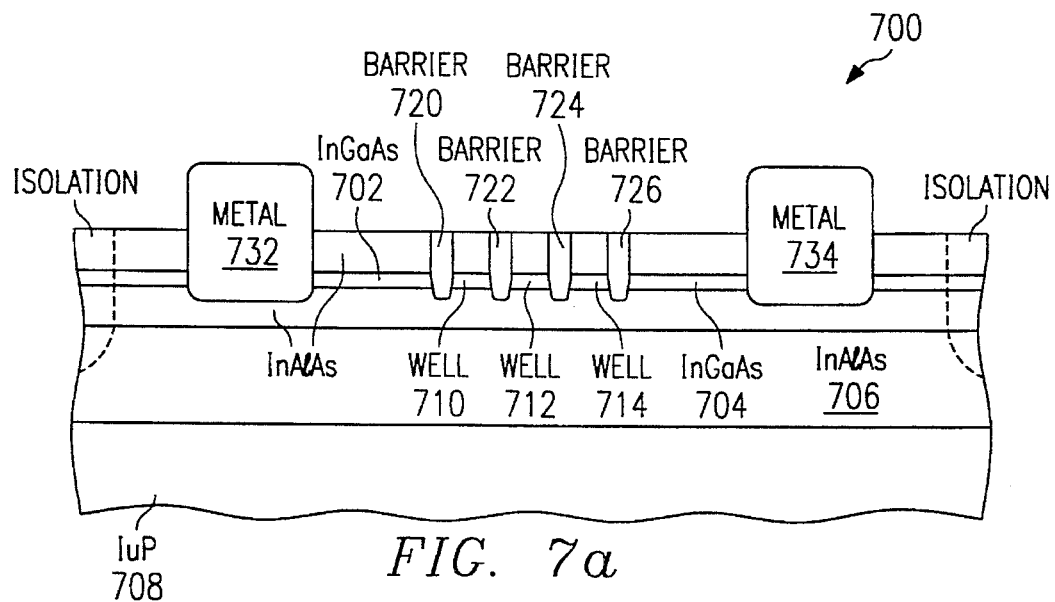
FIGS. 7a–b illustrate a multiple resonant tunneling preferred embodiment structure.
Figure 7B:
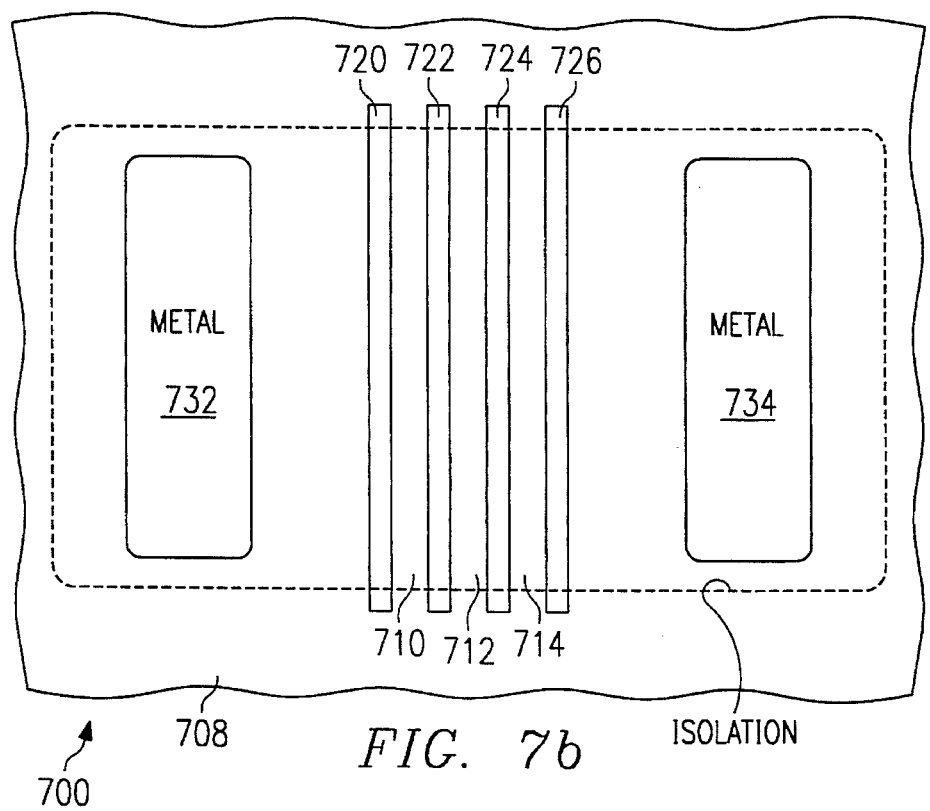

FIGS. 7a–b show a preferred embodiment multiple peaked lateral resonant tunneling structure, generally denoted by reference numeral 700, in cross sectional elevation and plan views, respectively, as including InGaAs quantum wells 710, 712, 714 clad with InAlAs, InAlAs tunneling barriers 720, 722, 724, 726 abutting the quantum wells, InGaAs anode 702, InGaAs cathode 704, metal anode contact 732, metal cathode contact 734, InAlAs buffer layer 736, and InP substrate wafer 708. The InGaAs heterojunction with AlGaAs has a conduction band discontinuity of about 0.6 eV, so n-type dopants in the InAlAs cladding on the InGaAs modulation dope the InGaAs.

The multiple quantum wells and barriers implies a multipeaked current-voltage behavior.

Multiple tunneling fabrication method

A preferred embodiment method of fabrication of the multiple lateral resonant tunneling essentially follows the method of FIGS. 6a–k but with a repetition of the metal ridge formation and thereby achieves multiple tunneling barriers. In particular, the multiple lateral resonant tunneling fabrication method includes the following steps:

(1) Begin with four-inch-diameter, semi-insulating InP wafer 800 with (100) orientation and 500 μm thickness. Then grow (such as by metalorganic chemical vapor deposition or molecular beam epitaxy) the epitaxial layers as listed in following Table II; note that InGaAs denotes $In_xGa_{1-x}As$ for X equal to 0.53, AlGaAs denotes $In_xAl_{1-x}As$ for X equal 0.52, and that silicon provides the n-type doping.

TABLE II

| Layer | Material | Thickness |
| --- | --- | --- |
| Cladding | n-InAlAs | 100 nm |
| Quantum well | n-InGaAs | 10 nm |
| Cladding | n-InAlAs | 100 nm |
| Buffer | InAlAs | 1 μm |
| Substrate | s.i. InP | 500 μm |

The buffer layer provides a low defect surface for the cladding and quantum well growth. The doping level of the n-type InAlAs and InGaAs is roughly $1-10^{18}$ atoms/cm$^3$.

Figure 8A:
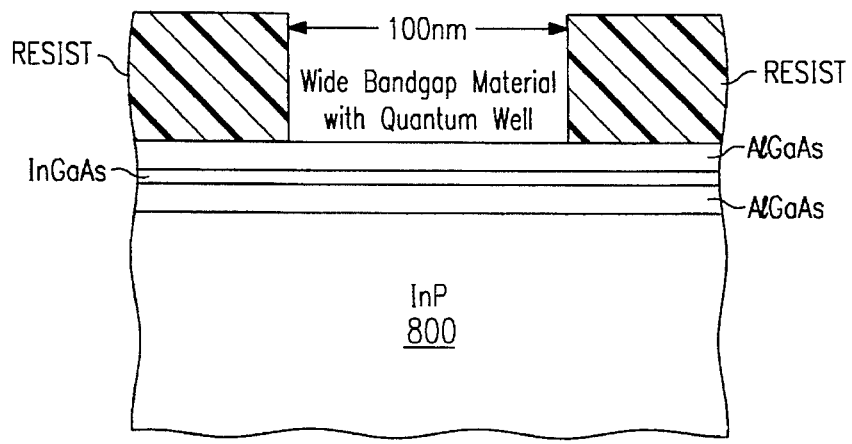
FIGS. 8a–p show fabrication steps of the second preferred embodiment method.

(2) Spin polymethylmethacrylate (PMMA) onto layered wafer 800 to a thickness of about 150 nm. Then use an e-beam to expose a near-minimum linewidth (about 100 nm wide) line which is 25 μm long in the PMMA; the lateral quantum wells will be parallel and within this line. Develop the PMMA; see FIG. 8a.

(3) Insert coated wafer 800 into an LPCVD chamber and deposit 40 nm of low temperature, conformal nitride 820 from silane plus ammonia. See FIG. 8b which illustrates the conformal deposition that leaves an depression of width about 20 nm as illustrated. The thickness of nitride 820 can be accurately controlled by a slow, low temperature, low pressure deposition, and the nitride thickness determines the width of the depression.

Figure 8B:
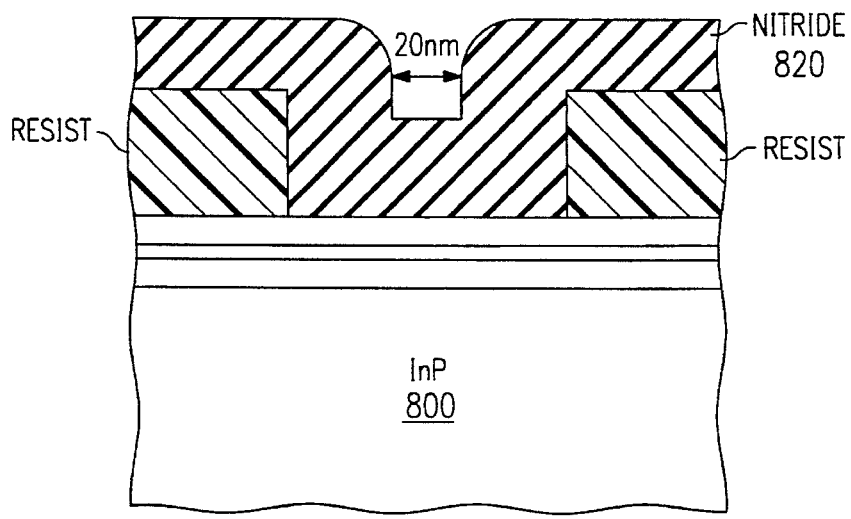
Figure 8C:
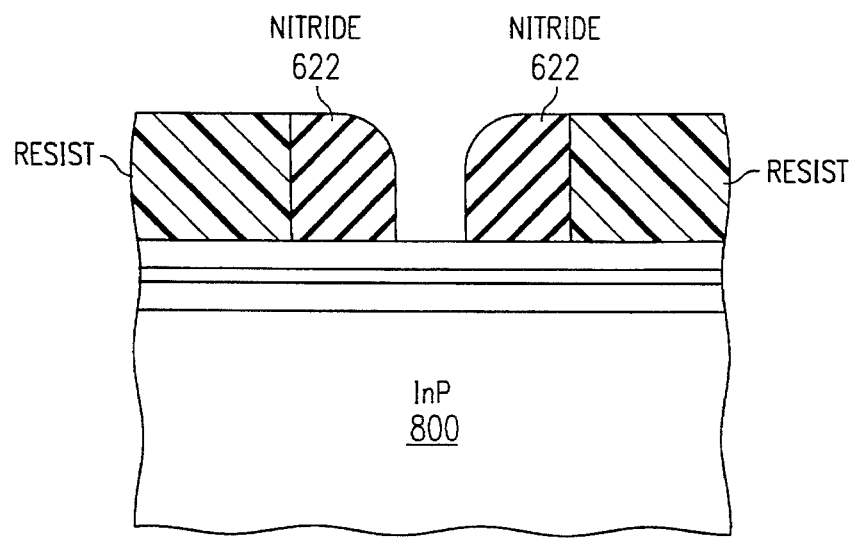

(4) Insert nitrided wafer 800 into a plasma etcher and anisotropically etch nitride 820 to remove about 100 nm. This effectively removes nitride 820 from horizontal areas and leaves only nitride filaments 822 on the vertical sidewalls of the PMMA. The etch exposes InAlAs, but with an etch chemistry with fluroides provides selectivity for nitride over Al compounds. See FIG. 8c. Note that a moderate overetch does not effect the width of the opening and the size of the exposed portion of InAlAs due to the verticality of the original nitride 820 sidewalls as shown in FIG. 8b.

Figure 8D:
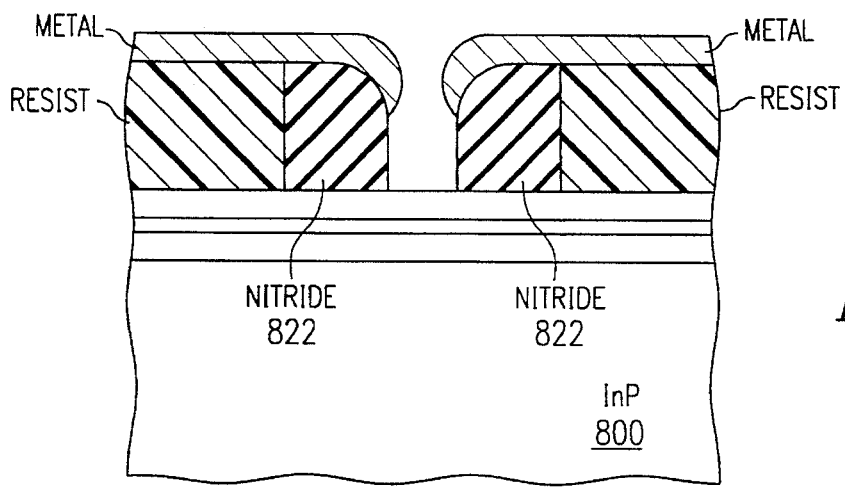

(5) Insert nitride-etched wafer 800 into a metal evaporation chamber and perform angled deposition of 10 nm of aluminum with angles of ±45° to the wafer surface and perpendicular to the line of exposed InAlAs. The deposition alternates between the two angles to put essentially the same amount of metal on each nitride sidewall as illustrated in FIG. 8d. This effectively symmetrically narrows the opening over the exposed InAlAs to about 10 nm.

Figure 8E:
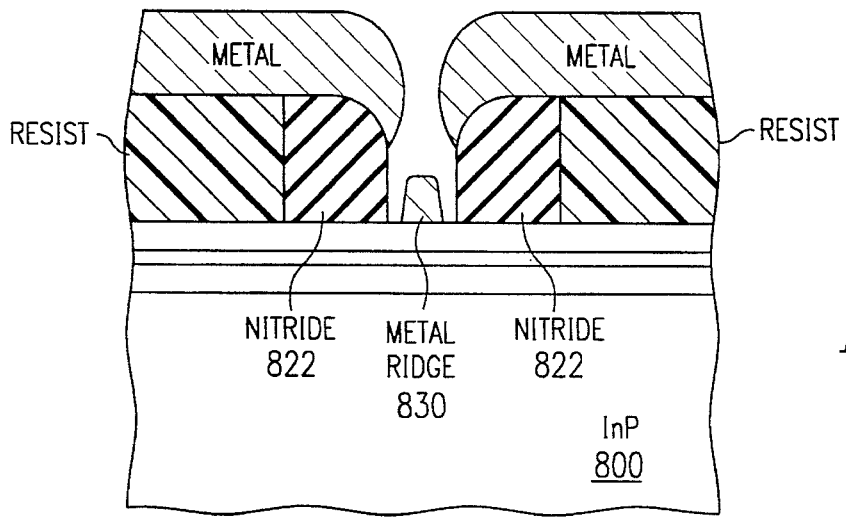

(6) After the angled deposition of metal, reorient the wafer and deposit 20 nm more aluminum but perpendicular to the wafer surface. This both thickens the existing aluminum on each nitride filament 822 and forms a freestanding metal ridge 830 about 20 nm high and 10 nm wide at the base and 20 μm long on the exposed InAlAs; see FIG. 8e. The overhang of the metal deposited in the angled deposition provides the roughly 5 nm separation of the base of metal ridge 830 from nitride filaments 822.

Figure 8F:
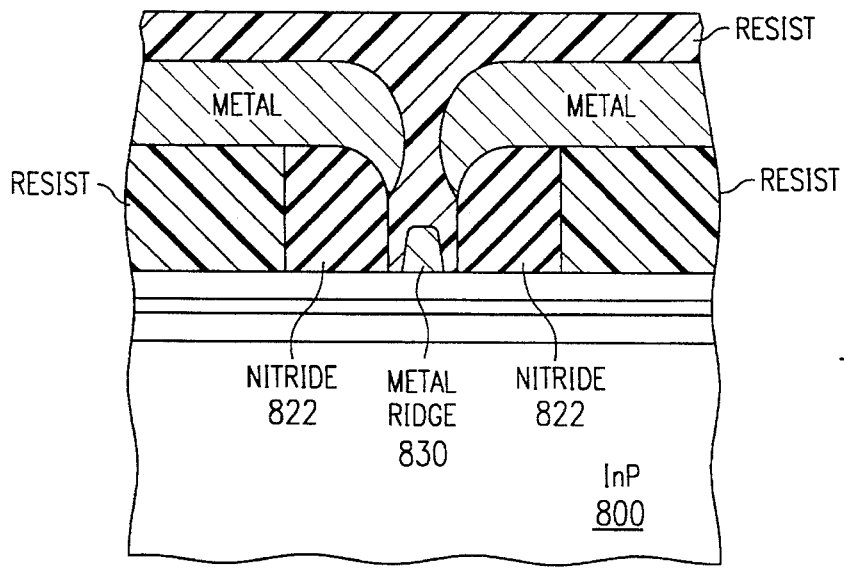
Figure 8G:
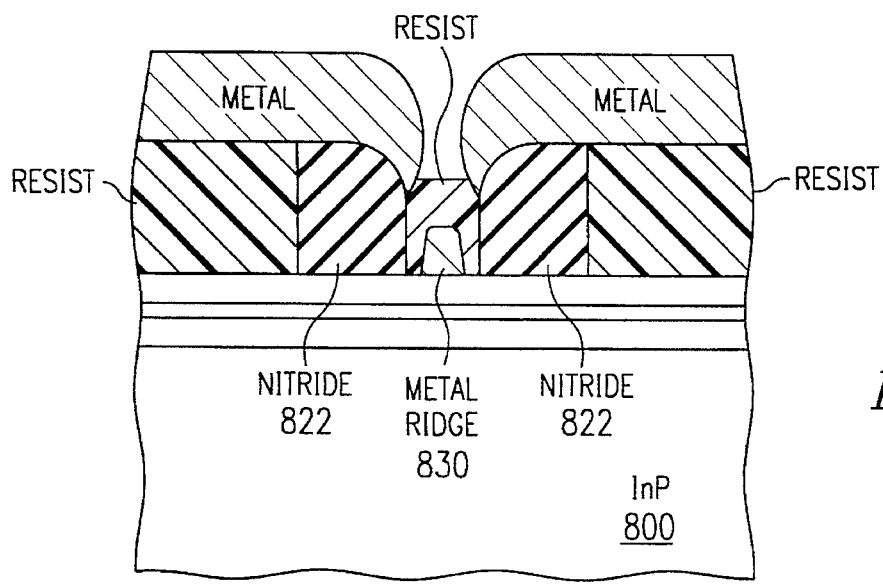
Figure 8H:
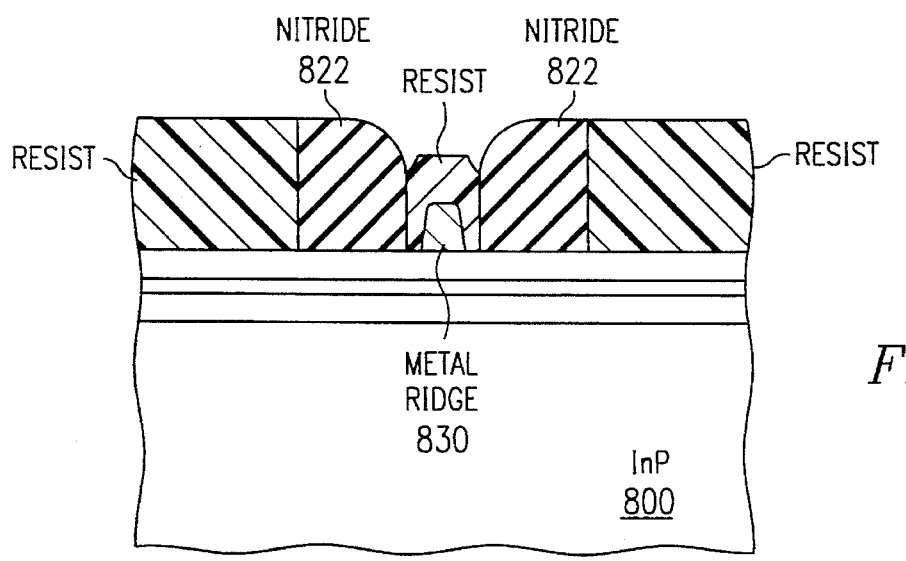

(7) Spin on about 50–100 nm of photoresist (or PMMA) on the wafer to fill the space between the nitride filaments and planarize as shown in FIG. 8f. Next, ash (plasma etch) the photoresist in an oxygen plasma, but stop the etch before completion to leave photoresist on metal ridge 830 as illustrated in FIG. 8g. Then strip the exposed metal to uncover nitride filaments 822 and the PMMA with either a KOH wet etch or a $BCl_3+Cl_2$ plasma etch. See FIG. 8h.

Figure 8I:
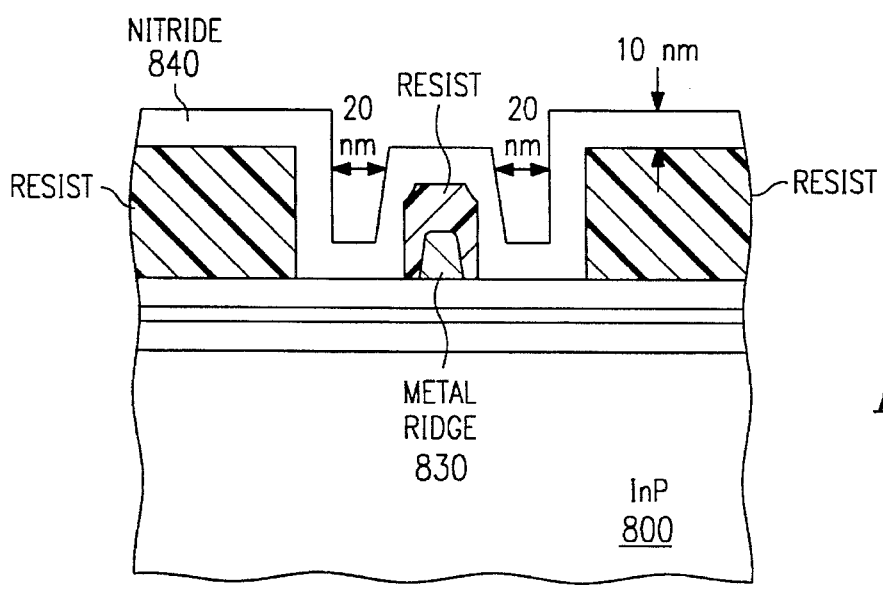
Figure 8J:
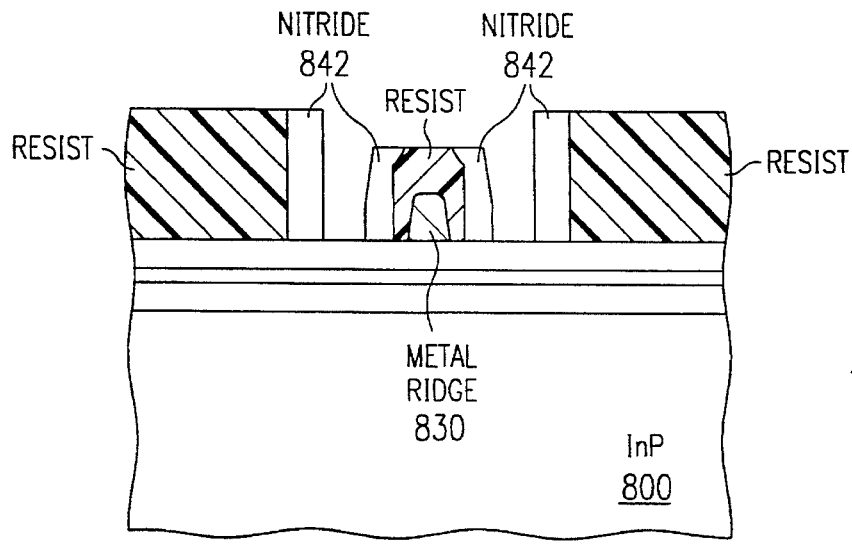

(8) Strip nitride filaments 822 with a fluoroform ($CHF_3$) plasma etch, the etch does not attack the InAlAs due to the nonvolatile nature of $AlF_3$. This leaves openings of width of about 40 nm between photoresist covered metal ridge 830 and the adjacent PMMA. Then insert wafer 800 into a LPCVD chamber and deposit 10 nm of conformal nitride 840 at low temperature. See FIG. 8i. Then again anisotropically etch the nitride to remove about 10–15 nm and thereby clear the horizontal areas but leave nitride filaments 842 on both the PMMA and the photoresist-covered metal ridge 830; see FIG. 8j.

Figure 8K:
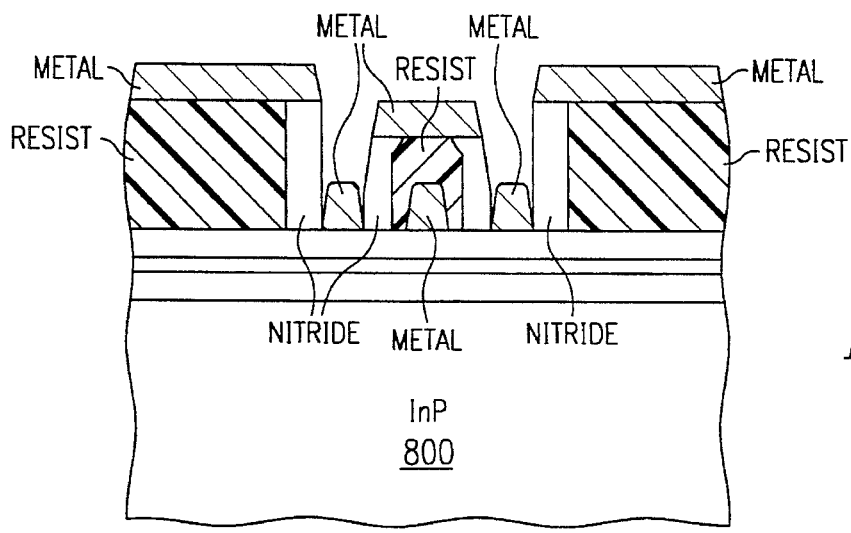

(9) Insert nitride-etched wafer 800 into a metal evaporation chamber and deposit about 20 nm of metal (aluminum) perpendicular to wafer surface. This forms two more 20 nm high and 20 nm wide metal ridges 832–834 on the exposed InAlAs plus puts metal on the horizontal PMMA surfaces; see FIG. 8k.

Figure 8L:
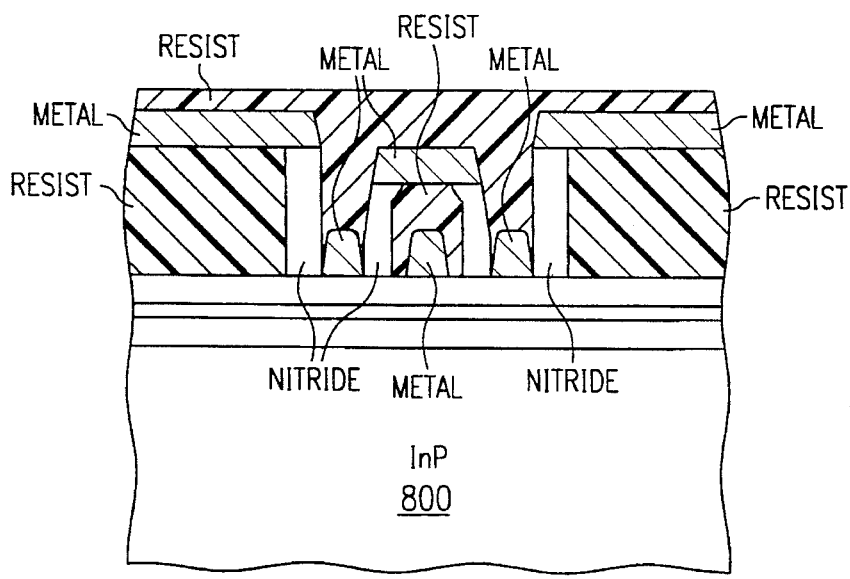
Figure 8M:
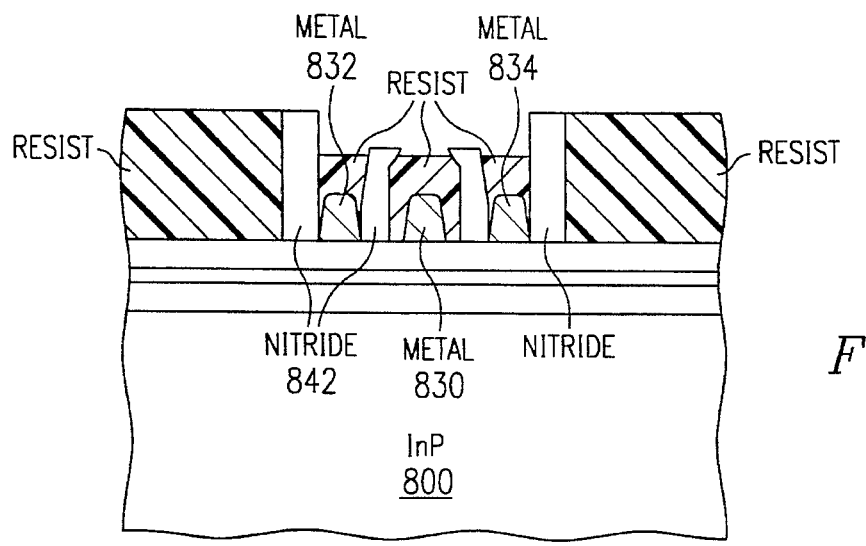
Figure 8N:
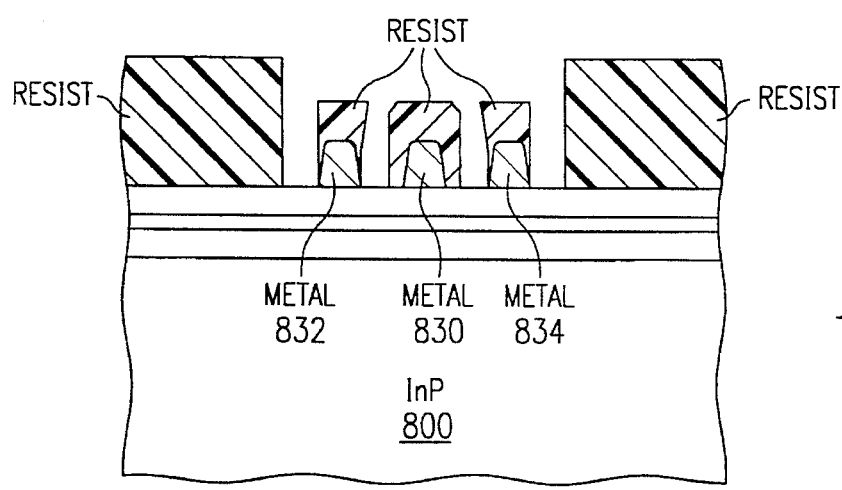

(10) Spin on about 50–100 nm of photoresist (or PMMA) on the wafer to fill the space between the nitride filaments and planarize as shown in FIG. 8l. Next, ash (plasma etch) the photoresist in an oxygen plasma to expose the tops of the nitride filaments, but stop the etch before completion to leave photoresist on metal ridges 830–832–834 as illustrated in FIG. 8m. Then strip the exposed nitride filaments with a fluride plasma which is selective to the underlying InAlAs as previously described. see FIG. 8n and note that metal ridges 830–832–834 provide support for the overlying photoresist. If thin ridges of photoresist were to be placed directly on the InAlAs, a problem of sticking to the surface would occur and be exacerbated by the large height-to-width ratio of the ridges. However, metal ridges 830–832–834 stick well to the InAlAs and provide support for the photoresist.

Figure 8O:
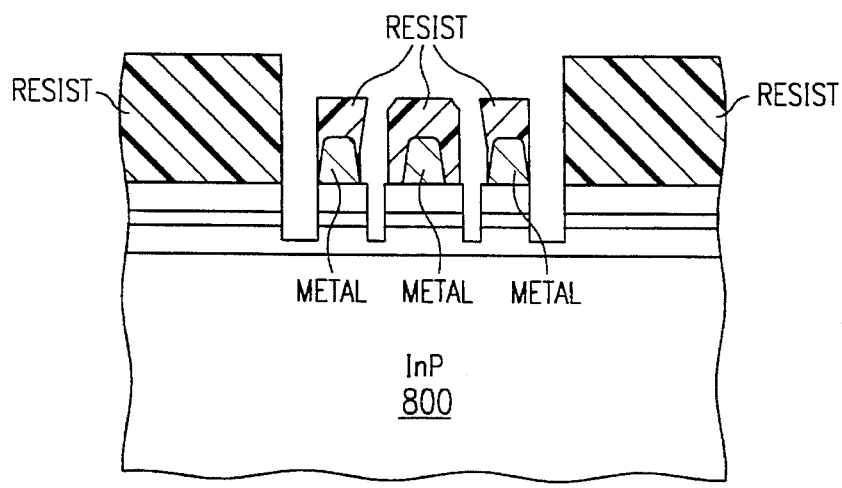

(11) Use the photoresist covered metal ridges 830–832–834 plus PMMA as an etch mask for an anisotropic plasma etch of InAlAs and InGaAs with chlorine to form a trenches between metal ridges 830–832–834 and also between the metal ridges and the PMMA; note that the etch need not be selective over mrtal because photoresistr covers the metal ridges. Each trench has a width of 10 nm and a depth of between 130 and 200 nm. See FIG. 8o.

(12) Strip the PMMA and photoresist and insert the wafer into an MBE growth chamber and grow InAlAs to fill the trenches; this will form the tunneling barriers, and the portion of InGaAs beneath the metal ridges will form the lateral quantum wells. The AlGaAs does not grow on the metal but will thicken the top InAlAs; see FIG. 8p. Now either the metal ridges 830–832–834 may be retained with possible contacts added to allow for modulation of the underlying quantum wells or the metal ridges could be removed to form a multipeaked diode.

(13) Spin on photoresist and pattern it to define the isolation region, and implant protons to damage the InAlAs and InGaAs crystal structure to form the isolation region. Strip the photoresist and spin on another layer of photoresist and pattern it to define the anode and cathode ohmic contacts and form the metal contacts by liftoff. This completes the multipeak diode.

Array of coupled quantum dots

FIG. 9 heuristically illustrates in perspective view an array of quantum dots preferred embodiment, generally denoted by reference numeral 900, as including metal contacts over quantum dots in an array with separation of the dots by tunneling barriers. The size of the array can easily be increased by repetition of the fabrication process which resembles the sublithographic line formation of the preceding embodiments.

Array fabrication

Figure 10A:
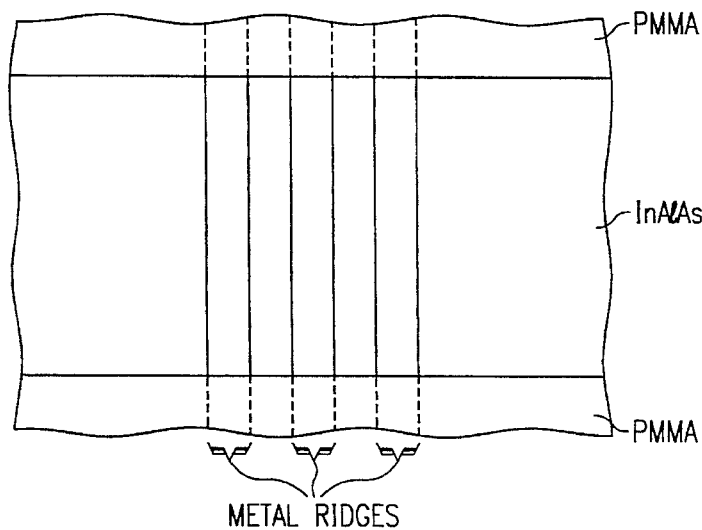
FIGS. 10a–c are plan views of steps in fabrication of the array of quantum dots.

Array of quantum dots 900 may be fabricated by essentially two repetitions of the method for fabrication of the multiple resonant tunneling diode. In particular, form three metal ridges as in FIGS. 8a–n. Then apply another layer of PMMA and e-beam define another 100-nm wide line perpendicular to the line leading to the metal ridges; FIG. 10a shows a plan view of a portion showing the exposed InGaAs cladding in the 100 nm wide opening in the PMMA where the opening crosses the three metal ridges.

Figure 10B:
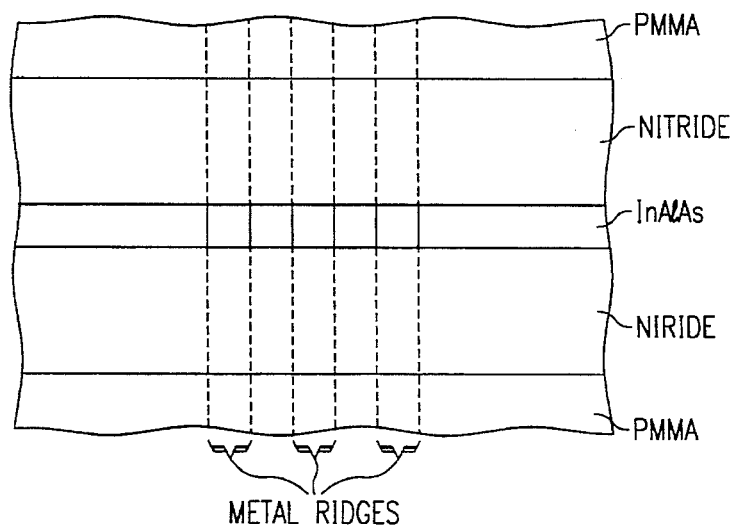
Figure 11A:
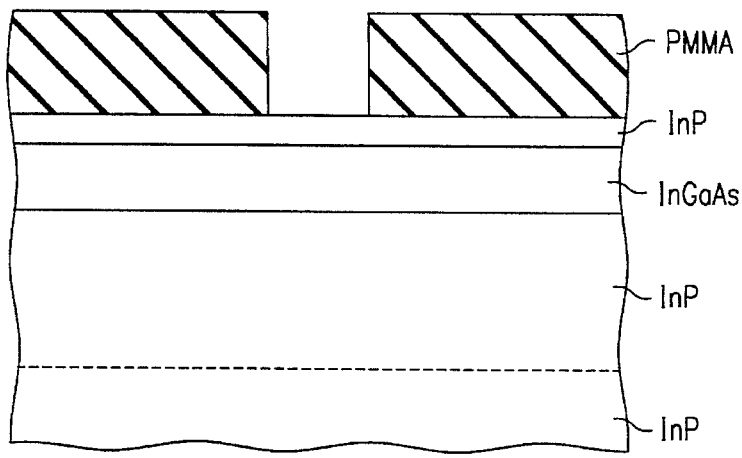
FIGS. 11a–f show fabrication steps of another preferred embodiment method.
Figure 11B:
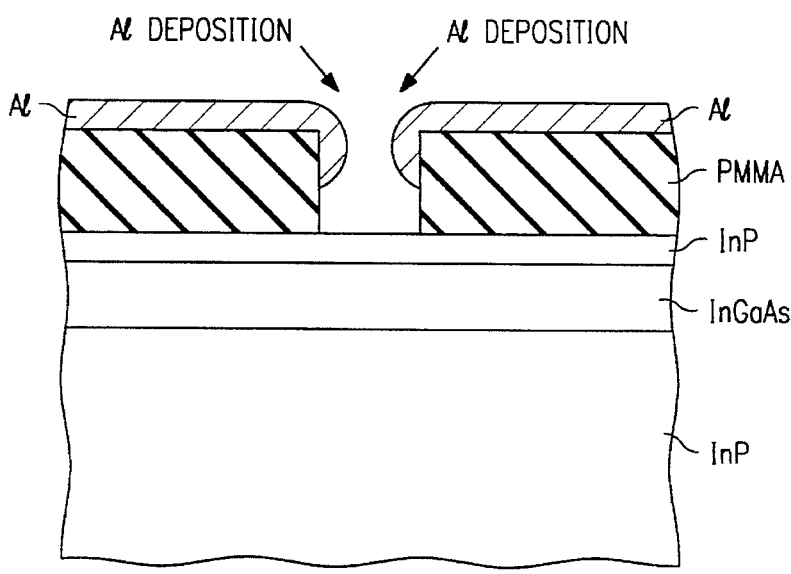
Figure 11C:
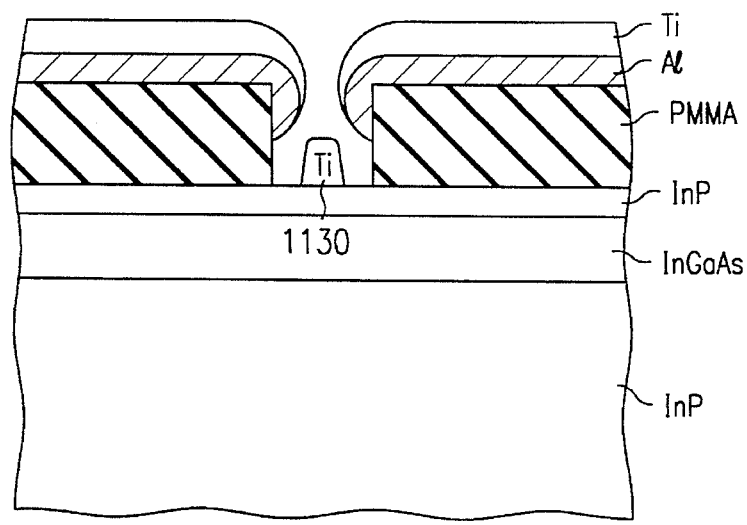

Again deposit 40 nm of nitride to leave a depression 20 nm wide and anisotropically etch to create 40-nm thick nitride filaments with a 20-nm wide opening which again exposes the InAlAs cladding plus sections of the three metal ridges previously made; FIG. 10b is the plan view. Fill the opening between the two nitride filaments with resist by spin-on to planarize and etchback. Next, selectively remove the two nitride filaments with phosphoric acid. Then conformally deposit 10 nm of nitride and anisotropically etch to leave four 10-nm thick nitride filaments (one on each PMMA sidewall and one on each resist sidewall) with two 20 nm gaps between. Then fill the two gaps with resist by spin on and etch back. Again, remove the nitride filaments with phosphoric acid; see FIG. 11c for the plan view. Lastly, etch the exposed metal and strip the resist to leave an array of metal contacts. Lastly, trench etch using the metal contacts as etch mask, and grow InAlAs in the trenches to form tunneling barriers between adjacent quantum dots (zero-dimensional quantum wells) which result under the metal contacts.

Fabrication without conformal dielectric opening reduction

The preferred embodiments may be altered by omission of the conformal nitride (or other dielectric) layer used to reduce the e-beam defined opening in the PMMA as in FIGS. 6b–c and 8b–c. In particular, the opening reduction without conformal dielectric deposition preferred embodiment method proceeds with the following steps:

(1) Begin with four-inch-diameter, semi-insulating InP wafer 1100 as the growth substrate. Then grow the undoped epitaxial layers as listed in following Table III; note that InGaAs denotes $In_xGa_{1-x}As$ for X a fraction such 0.4.

TABLE III

| Layer | Material | Thickness |
|---|---|---|
| Cladding | InP | 5 nm |
| Quantum well | InGaAs | 30 nm |
| Buffer | InP | 100 nm |
| Substrate | InP | 500 μm |

The buffer layer provides a low defect surface for the quantum well growth.

(2) Spin PMMA onto layered wafer 1100 to a thickness of about 150 nm. Then use an e-beam to expose a minimum linewidth (50 nm wide) line which is 25 μm long in the PMMA; the quantum well will lie along the center of this line. Develop the PMMA; see FIG. 11a.

(3) Insert wafer 1100 into a metal evaporation chamber and perform a first angled deposition of about 12.5 nm of aluminum with an angle of 45° to the wafer surface and perpendicular to the line of exposed InP, and then switch to a second angled deposition of 17.5 nm of aluminum also with an angle of 45° to the wafer surface but perpendicular to the first deposition angle and still perpendicular to the exposed InP. The aluminum all deposits on the PMMA and overhangs the exposed InP; see FIG. 11b where arrows indicate the two aluminum deposition directions.

(4) After the angled deposition of aluminum, deposit 45 nm of titanium but perpendicular to the wafer surface. This both deposits on the existing aluminum on the PMMA plus forms a freestanding metal ridge 1130 about 45 nm high and 40 nm wide at the base and 25 μm long on the exposed InP; see FIG. 11c. The overhang of the aluminum deposited in the angled deposition insured the 5 nm separation of the base of metal ridge 1130 from the PMMA.

Figure 11D:
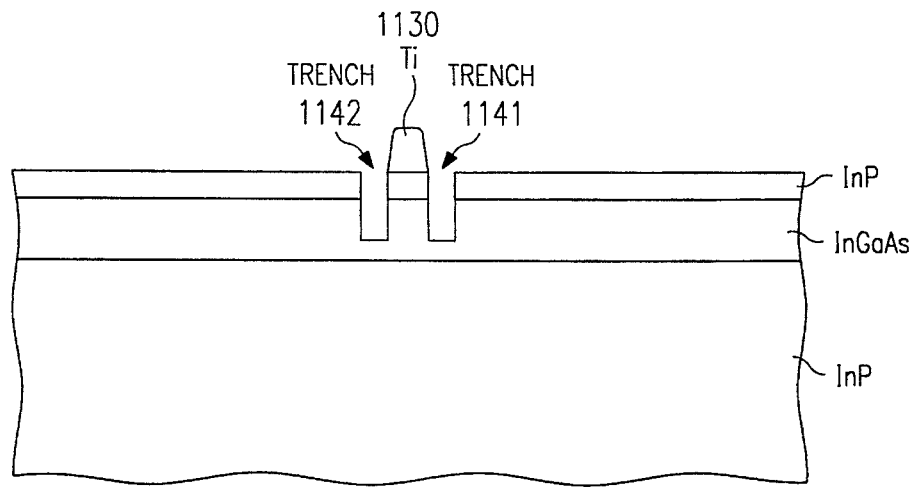

(5) Liftoff the aluminum (and covering titanium) by dissolution in a water solution of KOH. This leaves the PMMA and titanium ridge 1130 with two 5 nm wide stripes of exposed InP between. Then insert the wafer into an ion beam assisted etching chamber and etch trenches in the InP and InGaAs using the PMMA and titanium ridge as the etch mask. The etching gas mixture is chlorine plus argon at about equal flows and at a total pressure of about $10^{-5}$ Torr. This forms trenches 1141–1142 on each side of metal ridge 1130, each trench having a width of 5 nm and a depth of between 130 and 200 nm. Next, strip the PMMA with acetone and then an oxygen plasma; see FIG. 11d.

Figure 11E:
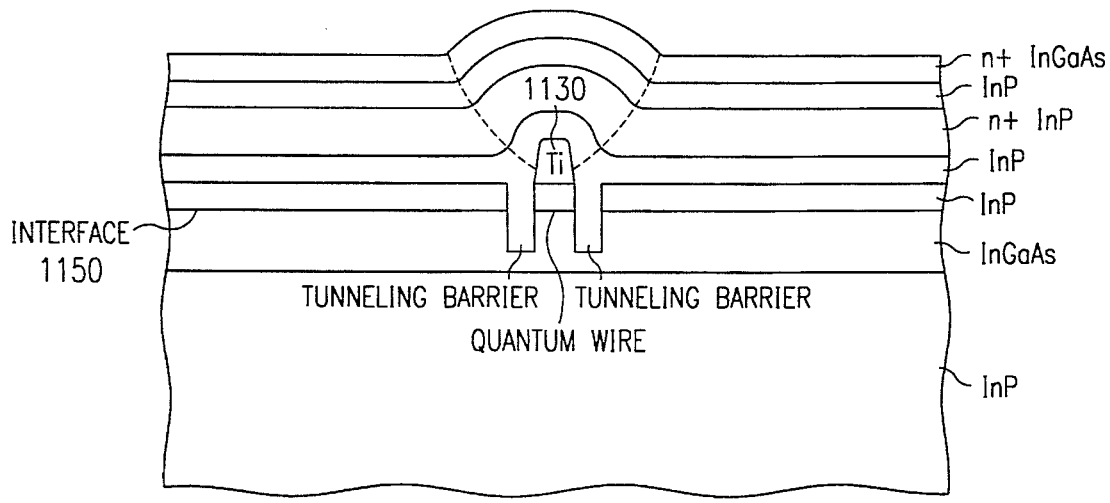

(6) Insert the wafer into an MOCVD growth chamber and grow the following layers: 5 nm of undoped InP (to fill trenches 1141–1142); 20 nm of silicon doped InP (dopant concentration $1 \times 10^{18}/cm^3$); 20 nm of undoped InP; and 5 nm of cap InGaAs doped with silicon to $5 \times 10^{18}/cm^3$). Again, the trench fill (InP) will form the tunneling barriers for lateral resonant tunneling, and the portion of InGaAs beneath metal ridge 1130 will form the quantum well. The InP and InGaAs may grow as high resistivity polycrystalline on titanium 1130; see FIG. 11e which suggests the boundary between epitaxial and polycrystalline growth with a broken line. Alternatively, the InP and InGaAs may not nucleate on the titanium and not grow at all, analogous to FIGS. 6j–k. MOCVD conditions dictate the growth type. The carriers (electrons) in the InGaAs quantum well are provided by modulation doping from the n+InP and accumulate at the InGaAs-InP interface 1150 adjacent to the n+InP. The InP in the trenches form tunneling barriers for these carriers and the region at the interface between the tunneling barriers forms a quantum wire as previously noted.

Figure 10C:
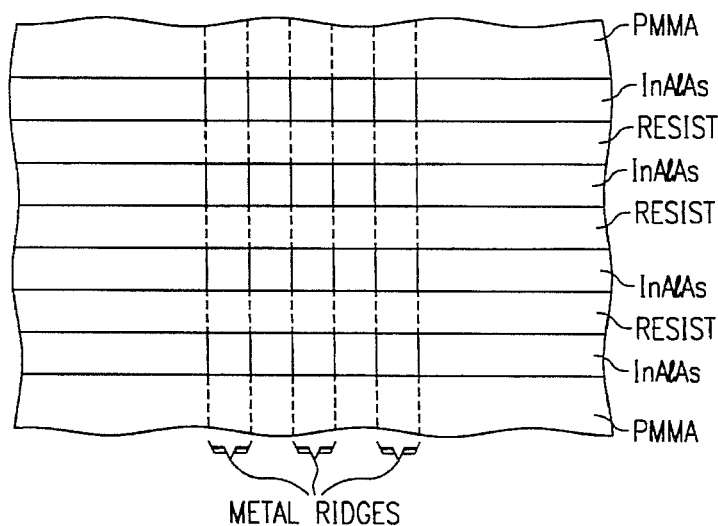
Figure 11F:
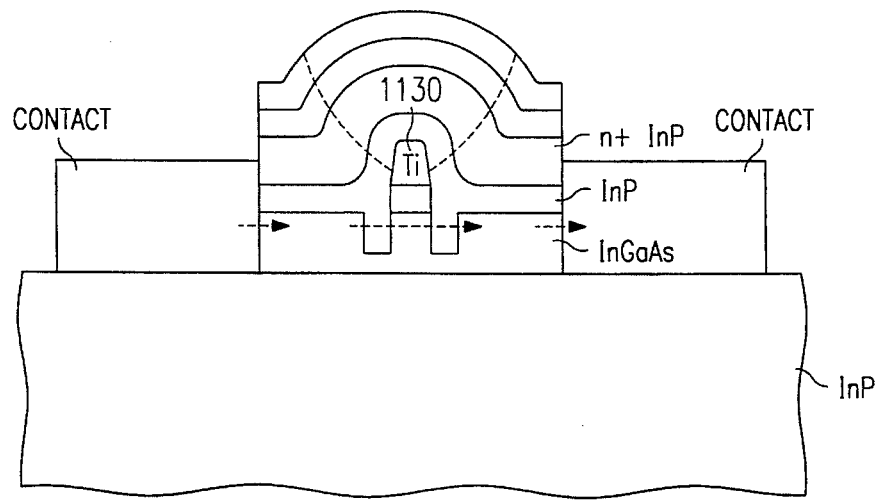

(7) Spin on PMMA and e-beam pattern it to define first mesa regions which define the widths of the quantum wells; this is analogous to the transverse lithography of FIGS. 10b–c. The e-beam can provide linewidths down to about 50 nm. Thus separated parrallel resonant tunneling current paths can be formed. Etch the semiconductor layers with the patterned PMMA as mask again with ion beam assisted etching using a chlorine plus argon mixture; again the etch need only penetrate into the quantum well InGaAs layer. Strip the PMMA and spin on a layer of photoresist and pattern it to define the location of isolation mesas for each current path and wet etch (sulfuric acid plus hydorgen peroxide for InGaAs, next phosphoric acid for InP, and then again sulfuric acid plus hydrogen peroxide for the InGaAs quantum well, stopping on the InP buffer). Lastly, form the metal contacts by liftoff: spin on photoresist and pattern it to define the anode and cathode locations, evaporate gold germanium, then nickel, and lastly thick gold, and liftoff. This completes the diode as shown in FIG. 11f which suggests the resonant tunneling current flow with the broken arrows.

Modifications

The preferred embodiments may be varied in many ways while retaining one or more of the features of angled deposition for shadowing to define tunneling barrier thicknesses, simultaneous two directional shadowing to define both a quantum well and tunneling barrier lateral dimension, forming multiple adjacent (coupled) resonant tunneling barriers and quantum wells with a single trench etching and refill by repeated angled and conformal depositions to define thicknesses, and forming metal to assist attachment of resist to semiconductor surfaces.

For example, the angles of deposition of the material for creating the overhang could be multiple and varied between (i) close to perpendicular provided no deposition occurs on the semiconductor surface (thus the height-to-width aspect ratio of the opening in the PMMA or resist or nitride filaments determines how close to perpendicular the deposition directions can be) and (ii) close to parallel provided sufficient material can build up to form an overhang. And the angled depositions could be repeated; for example, with the structure of FIG. 8j angled depositions could be used again on the nitride to again define small thicknesses between nitride and vertically deposited metal by overhang. And the dimensions of the tunneling barriers and quantum well(s) could be varied: the tunneling barriers could be thinner for higher current, the tunneling barriers could be of differing thicknesses, and the quantum well thickness could be varied to adjust the resonant levels up or down. The thickness of the tunneling barriers is controlled by the overhang of the angled deposition(s), so a wide range of thicknesses are easily made. The materials could be varied such as InAlAs barrier for InGHaAs wells in InP, and so forth.

What is claimed is:

1. A method of fabricating a lateral resonant tunneling structure, comprising the steps of:
   (a) depositing a layer of a first material on a semiconductor body, said layer with an opening exposing a portion of a surface of said semiconductor body;
   (b) depositing a second material at said opening and in a direction differing from perpendicular to said portion of a surface;
   (c) then depositing a third material at said opening and in a direction perpendicular to said portion of a surface;
   (d) removing at least a part of said third material over said first material;
   (e) trenching said semiconductor material at said portion of a surface and away from said third body
   (f) refilling the trench made by said trenching in said semiconductor material,
2. The method of claim 1, wherein:
   (a) said semiconductor material is a III–V compound.
3. The method of claim 1, wherein:
   (a) said first material is PMMA;
   (b) said second material is aluminum; and
   (c) said third material is aluminum.
4. The method of claim 1, wherein:
   (a) said first material is PMMA;
   (b) said second material is aluminum; and
   (c) said third material is titanium.
5. The method of claim 1, wherein:
   (a) said trenching is by ion beam assisted etching.

* * * * *